United States Patent
Kho et al.

(10) Patent No.: US 10,234,913 B1
(45) Date of Patent: Mar. 19, 2019

(54) APPARATUS, SYSTEM, AND METHOD FOR SECURING EXPANSION CARDS TO PRINTED CIRCUIT BOARDS

(71) Applicant: Facebook, Inc., Menlo Park, CA (US)

(72) Inventors: Chuankeat Kho, San Jose, CA (US); John Edward Fernandes, Fremont, CA (US); Yueming Li, Mountain View, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/825,717

(22) Filed: Nov. 29, 2017

(51) Int. Cl.
*G06F 1/18* (2006.01)
*H05K 1/14* (2006.01)
*H05K 3/36* (2006.01)
*H01R 12/70* (2011.01)
*H01R 12/73* (2011.01)

(52) U.S. Cl.
CPC ......... *G06F 1/185* (2013.01); *H01R 12/7029* (2013.01); *H01R 12/73* (2013.01); *H05K 1/144* (2013.01); *H05K 3/36* (2013.01); *H05K 2201/042* (2013.01); *H05K 2201/10265* (2013.01); *H05K 2201/10325* (2013.01); *H05K 2201/10393* (2013.01)

(58) Field of Classification Search
CPC combination set(s) only.
See application file for complete search history.

(56) References Cited

U.S. PATENT DOCUMENTS

| 4,927,111 A * | 5/1990 | Takahashi | H05K 7/1417 211/41.17 |
| 4,952,158 A * | 8/1990 | Nakagawa | F16B 5/065 174/138 G |
| 5,754,412 A * | 5/1998 | Clavin | H05K 7/142 174/138 D |
| 6,173,843 B1 * | 1/2001 | Christensen | G06F 1/184 211/41.17 |
| 6,259,032 B1 * | 7/2001 | Fernandez | H01R 4/64 174/138 E |
| 6,404,646 B1 * | 6/2002 | Tsai | G06F 1/184 174/138 G |
| 6,625,041 B1 * | 9/2003 | Chen | H05K 5/0286 24/293 |
| 6,864,433 B1 * | 3/2005 | Fetzer | H05K 7/1417 174/138 G |
| 6,985,367 B1 * | 1/2006 | Scigiel | H05K 7/142 174/138 D |
| 7,034,223 B2 * | 4/2006 | Fan | G06F 1/184 174/138 G |
| 7,045,715 B2 * | 5/2006 | Ono | B60R 16/0215 174/135 |

(Continued)

*Primary Examiner* — Lisa Lea-Edmonds
(74) *Attorney, Agent, or Firm* — FisherBroyles, LLP

(57) ABSTRACT

An expansion card latching mechanism may include a base anchored to a printed circuit board. The latching mechanism may also include a latch coupled to the base such that a proximal end of the latch locks a proximal end of an expansion card to a fixed position on the printed circuit board. In addition the latching mechanism may include a compression spring wrapped around an arm of the latch such that the compression spring exerts a tension to maintain a locked position of the latch. Various other apparatuses, systems, and methods are also disclosed.

20 Claims, 9 Drawing Sheets

(56) References Cited

U.S. PATENT DOCUMENTS

| | | | | |
|---|---|---|---|---|
| 7,085,141 B2* | 8/2006 | Yi | ............ | H05K 7/142 |
| | | | | 174/138 E |
| 7,505,286 B2* | 3/2009 | Brovald | ............ | H05K 7/1417 |
| | | | | 174/138 E |
| 7,554,815 B2* | 6/2009 | Hardt | ............ | H05K 7/1487 |
| | | | | 361/742 |
| 7,583,517 B2* | 9/2009 | Hartman | ............ | H05K 7/142 |
| | | | | 361/807 |
| 8,149,590 B2* | 4/2012 | Cho | ............ | H05K 7/142 |
| | | | | 174/138 E |
| 8,802,992 B2* | 8/2014 | Chiu | ............ | H05K 7/142 |
| | | | | 174/138 G |
| 9,245,818 B2* | 1/2016 | Boyd | ............ | H05K 3/301 |
| 9,454,190 B2* | 9/2016 | Mao | ............ | H05K 7/1487 |

* cited by examiner

APPARATUS, SYSTEM, AND METHOD FOR SECURING EXPANSION CARDS TO PRINTED CIRCUIT BOARDS

BACKGROUND

Computing devices often require upgrades and modifications to keep up with additional needs in processing power or storage space. For example, a large data center may require additional storage components or higher-capacity memory as old storage becomes full. Traditionally, upgrades may be performed by swapping out older components with newer parts or adding expansion cards to existing systems.

However, systems that require frequent upgrades or a large volume of expansion components may experience difficulties in easily adding new components. For example, traditional methods of mounting expansion cards, such as screws, require the appropriate tools and a certain amount of time to install and remove the cards. When expansion cards are installed in recessed areas that have little room to spare, additional tools may not be feasible for reaching the cards. Additionally, these traditional mounting methods may also be prone to breakage or may cause breakage of computing components, especially for parts that may be frequently swapped. Furthermore, some computing systems may deploy automation to perform certain tasks, including installation and removal of expansion cards. In these instances, complex mounting mechanisms may be too difficult to automate for robotic machines. Therefore, improved methods of mounting expansion components are required to overcome these disadvantages of traditional methods.

SUMMARY

As will be described in greater detail below, the instant disclosure describes various apparatuses, systems, and methods for securing expansion cards to printed circuit boards by locking the expansion cards in place with a tool-less latch. In one example, an expansion card latching mechanism may include a base anchored to a printed circuit board. The expansion card latching mechanism may also include a latch coupled to the base such that a proximal end of the latch locks a proximal end of an expansion card to a fixed position on the printed circuit board. Additionally, the expansion card latching mechanism may include a compression spring wrapped around an arm of the latch such that the compression spring exerts tension to maintain a locked position of the latch.

In some embodiments, the latch may be coupled to the base such that the arm of the latch slides within the base and a grip of the latch covers the base. In these embodiments, a horizontal force applied to the grip of the latch, away from the expansion card, may compress the compression spring such that the latch slides away from the locked position to unlock the expansion card.

In some examples, the proximal end of the latch may extend over the proximal end of the expansion card in the locked position of the latch. The proximal end of the latch may extend in such a manner that the latch prevents the expansion card from lifting upward from the printed circuit board.

In one embodiment, the proximal end of the latch may include an angled surface such that a downward force on the expansion card slides the proximal end of the expansion card along the angled surface. In this embodiment, the downward force on the expansion card may exert a horizontal force to unlock the latch until the proximal end of the expansion card is under the latch.

In one example, the compression spring may be dimensioned to fit within the base. Additionally, the compression spring may exert tension between the latch and the base to force the proximal end of the latch toward the expansion card.

According to various embodiments, a corresponding computing component may include a printed circuit board. The computing component may also include one or more expansion cards modularly mounted on the printed circuit board. Furthermore, the computing component may include one or more latching mechanisms coupled to each expansion card. In these embodiments, a latching mechanism may include a base anchored to the printed circuit board, a latch coupled to the base such that a proximal end of the latch locks a proximal end of the expansion card to a fixed position on the printed circuit board, and a compression spring wrapped around an arm of the latch such that the compression spring exerts tension to maintain a locked position of the latch.

In one example, the expansion card may be designed to perform a specific computing task and may include a connector at a distal end that is dimensioned to be inserted into a socket of the printed circuit board. In this example, the socket may electrically couple the expansion card to the printed circuit board.

In one embodiment, the latch of the computing component may be coupled to the base such that the arm of the latch slides within the base and a grip of the latch covers the base. Additionally, in the above computing component, a horizontal force applied to the grip of the latch, away from the expansion card, may compress the compression spring such that the latch slides away from the locked position to unlock the expansion card.

In some examples, the proximal end of the latch of the computing component may extend over the proximal end of the expansion card in the locked position of the latch such that the latching mechanism prevents the expansion card from lifting upward from the printed circuit board. Additionally or alternatively, the proximal end of the above latch may include an angled surface such that a downward force on the expansion card slides the proximal end of the expansion card along the angled surface to unlock the latching mechanism until the proximal end of the expansion card is under the latch.

In some embodiments, the compression spring of the above latch may be dimensioned to fit within the base. Additionally, the compression spring of the above computing component may exert tension between the latch and the base to force the proximal end of the latch toward the expansion card.

In addition to the various systems and apparatuses described herein, the instant disclosure presents exemplary methods for securing expansion cards to printed circuit boards. For example, a corresponding method may include anchoring a base to a printed circuit board. The method may also include coupling a latch to the base such that a proximal end of the latch locks a proximal end of an expansion card to a fixed position on the printed circuit board. Additionally, the method may include wrapping a compression spring around an arm of the latch such that the compression spring exerts tension to maintain a locked position of the latch.

In one embodiment, coupling the latch to the base may include sliding the arm of the latch into the base. Additionally, coupling the latch to the base may include covering the base with a grip of the latch.

In some examples, the proximal end of the latch may include an angled surface such that a downward force on the expansion card slides the proximal end of the expansion card along the angled surface. In these examples, the downward force may also exert a horizontal force to unlock the latch until the proximal end of the expansion card is under the latch.

In some embodiments, the above method may further include dimensioning the proximal end of the latch to extend over the proximal end of the expansion card in the locked position of the latch such that the latch prevents the expansion card from lifting upward from the printed circuit board. Additionally or alternatively, the above method may further include dimensioning the compression spring to fit within the base and exert tension between the latch and the base to force the proximal end of the latch toward the expansion card.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
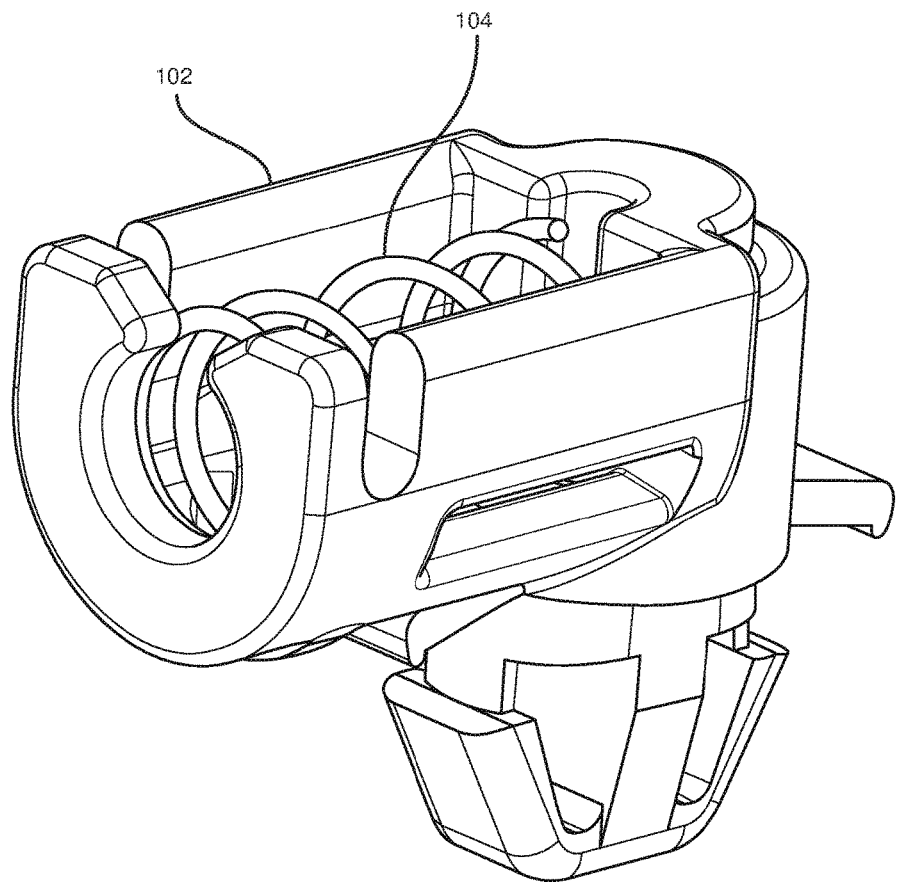
FIG. 1 is a perspective view of a compression spring coupled to a base component.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather the instant disclosure covers all modifications, equivalents, and alternatives falling within the scope of the appended claims.

DETAILED DESCRIPTION OF EXEMPLARY EMBODIMENTS

The present disclosure describes and illustrates various apparatuses systems, and methods for securing expansion cards to printed circuit boards. As will be explained in greater detail below embodiments of the instant disclosure may improve expansion card mounting by coupling a latching mechanism to a printed circuit board for tool-less installation. A spring may exert a force to keep the latching mechanism locked in place around an expansion card. For example, the spring may create tension between a latch and a base component to prevent the latch from sliding open. Additionally, the latching mechanism may be implemented as part of a computing component that includes a socket to electrically couple the expansion card. Thus, the embodiments described herein may facilitate easier and faster swapping of expansion components on printed circuit boards.

The following will provide, with reference to FIGS. 1-4, detailed descriptions of a latching mechanism. In addition, the discussion associated with FIGS. 5-7 will provide examples of the function of the latching mechanism in unlocking and locking an expansion card on a printed circuit board. The discussion associated with FIG. 8 will provide examples of a computing component incorporating multiple latching mechanisms for expansion cards. Finally, the discussion corresponding to FIG. 9 will provide example methods for manufacturing, assembling, configuring, and/or using the latching mechanisms presented herein.

FIG. 1 illustrates a perspective view of a compression spring 104 coupled to a base 102. In some examples, the term "compression spring" generally refers to a coil that resists compression and exerts an opposite force or tension to maintain an original shape. In some examples, compression spring 104 may be dimensioned to fit within base 102. As illustrated in FIG. 1, compression spring 104 may be entirely contained by the body of base 102.

Figure 2:
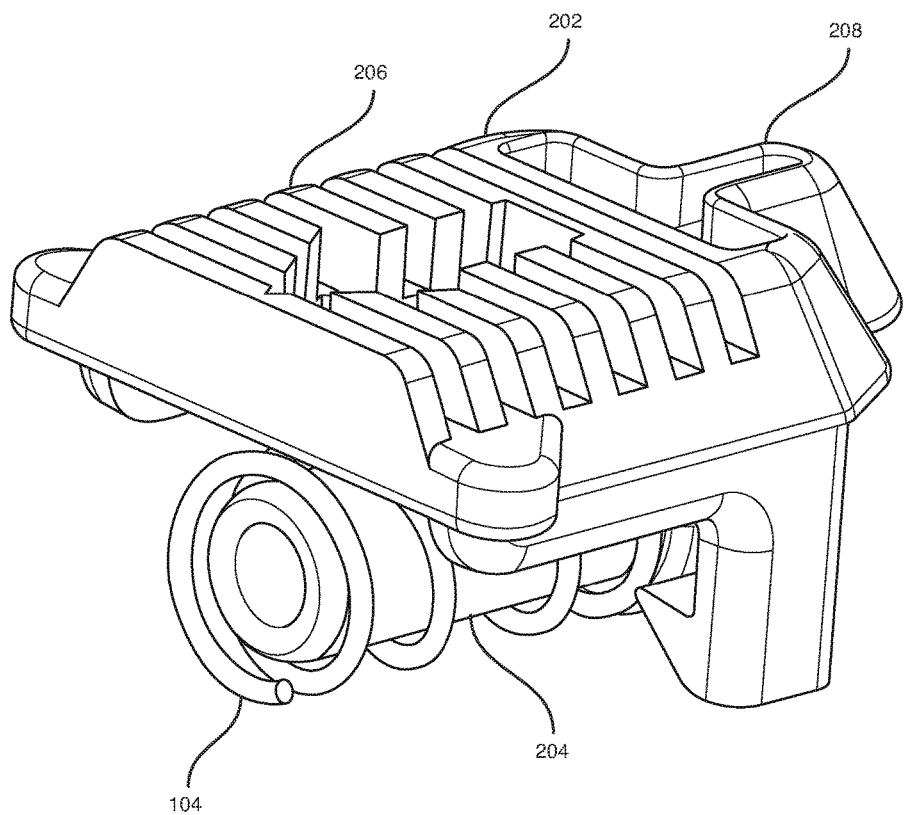
FIG. 2 is a perspective view of the compression spring coupled to an arm of a latch.

FIG. 2 illustrates a perspective view of compression spring 104 coupled to an arm 204 of a latch 202. In some embodiments, compression spring 104 may wrap around arm 204 of latch 202 such that compression spring 104 exerts a tension to maintain a locked position of latch 202. Additionally latch 202 may include a grip 206 for ease of manual handling. For example, grip 206 may provide friction to enable human fingers to easily maneuver latch 202. Furthermore, latch 202 may include a proximal end 208 with an angled surface.

Figure 3:
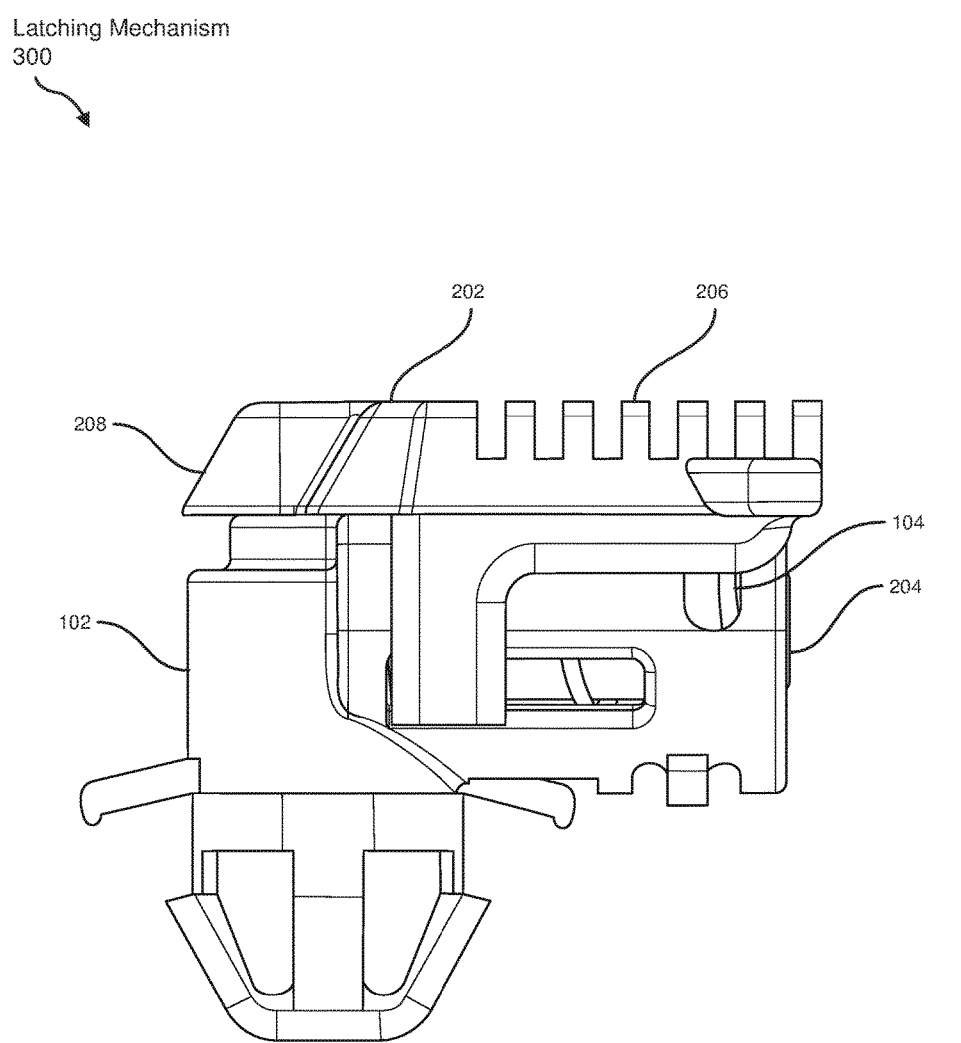
FIG. 3 is a side view of a locked latching mechanism.

FIG. 3 illustrates a side view of a latching mechanism 300 in a locked position. In one example, latch 202 may be coupled to base 102 such that arm 204 of latch 202 slides within base 102. In this example, grip 206 of latch 202 may cover base 102. In additional examples, compression spring 104 may exert tension between latch 202 and base 102 to maintain the locked position.

Figure 4:
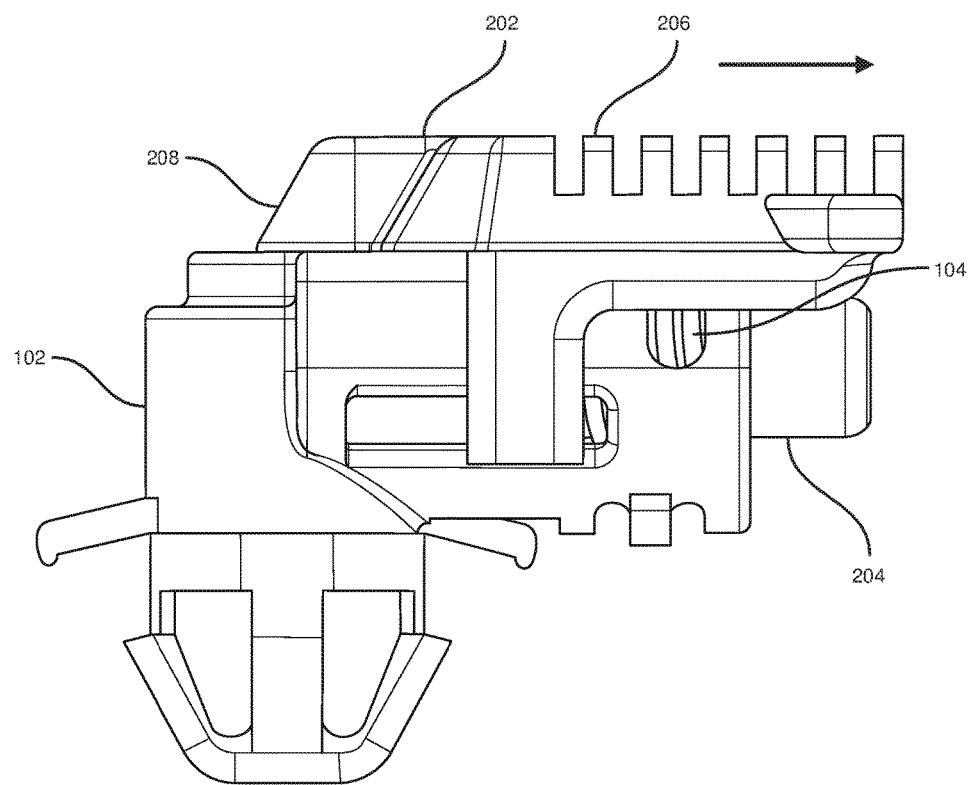
FIG. 4 is a side view of an unlocked latching mechanism.

FIG. 4 illustrates a side view of latching mechanism 300 in an unlocked position. In one embodiment, a horizontal force applied to grip 206 of latch 202 may compress compression spring 104 such that latch 202 slides away from the locked position. To unlock latching mechanism 300, the applied horizontal force may be greater than the tension of compression spring 104 to overcome the natural locked state of latching mechanism 300.

Figure 5:
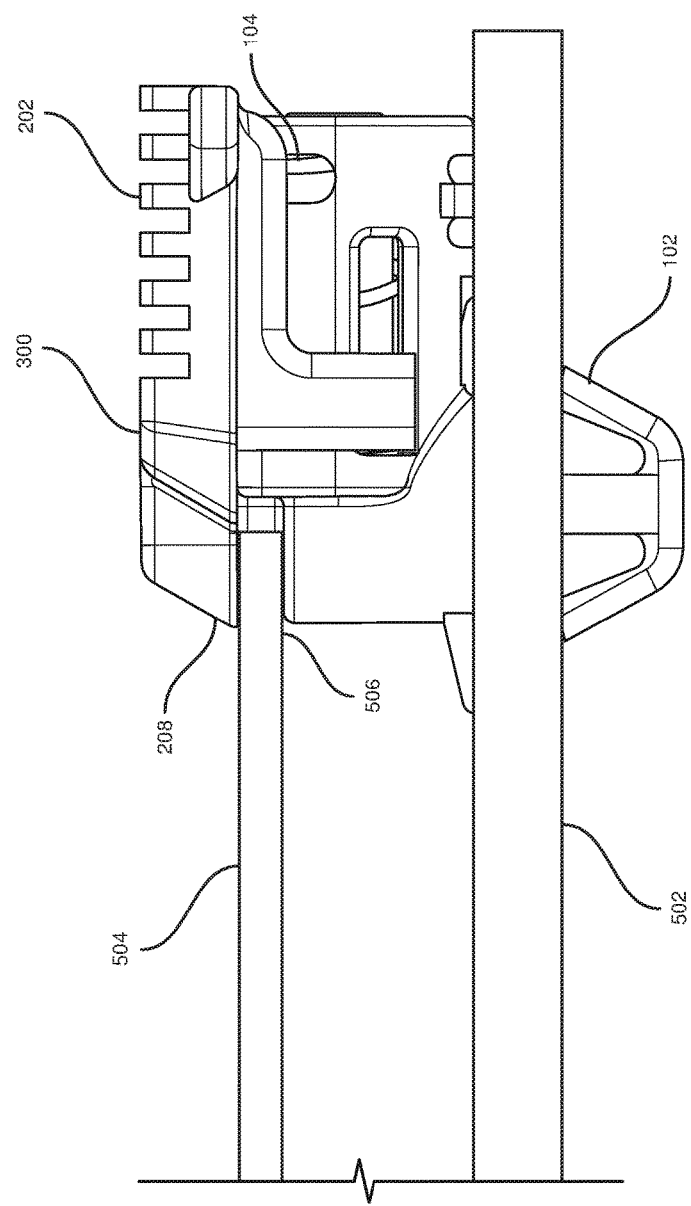
FIG. 5 is a side view of a latching mechanism locking an expansion card to a printed circuit board.

FIG. 5 illustrates a side view of latching mechanism 300 locking an expansion card 504 to a printed circuit board 502. The term "expansion card," in some examples, generally refers to a component, such as a card formed from a printed circuit board, that is configured for insertion into a corresponding computing device or expansion socket to expand the functionality of the computing device. The term "printed circuit board," in some examples, generally refers to a physical board on which computing components may be attached or embedded such that the board provides electrical connections between the computing components.

In some embodiments, base 102 of latching mechanism 300 may be anchored to printed circuit board 502. For example, as illustrated in FIG. 5, the bottom of base 102 may be inserted through a hole in printed circuit board 502 and held in place by the sides of a biased anchor.

Additionally, latch 202 of latching mechanism 300 may then be coupled to base 102 such that proximal end 208 of latch 202 locks a proximal end 506 of expansion card 504 to a fixed position on printed circuit board 502. In these embodiments, proximal end 208 of latch 202 may extend over proximal end 506 of expansion card 504 in the locked position of latch 202 such that latch 202 of latching mechanism 300 prevents expansion card 504 from lifting upward from printed circuit board 502. Proximal end 208 of latch 202 may be dimensioned based on a thickness and/or other dimensions of expansion card 504, such that latching mechanism 300 maintains a secure hold on expansion card 504. In the example of FIG. 5, proximal end 506 of expansion card 504 may be held between proximal end 208 of latch 202 and a ledge of base 102.

In some examples, compression spring 104 may exert the tension between latch 202 and base 102 to force proximal end 208 of latch 202 toward expansion card 504. In these examples, compression spring 104 may maintain the locked position of latching mechanism 300 by ensuring proximal end 208 of latch 202 remains extended over proximal end 506 of expansion card 504.

Figure 6:
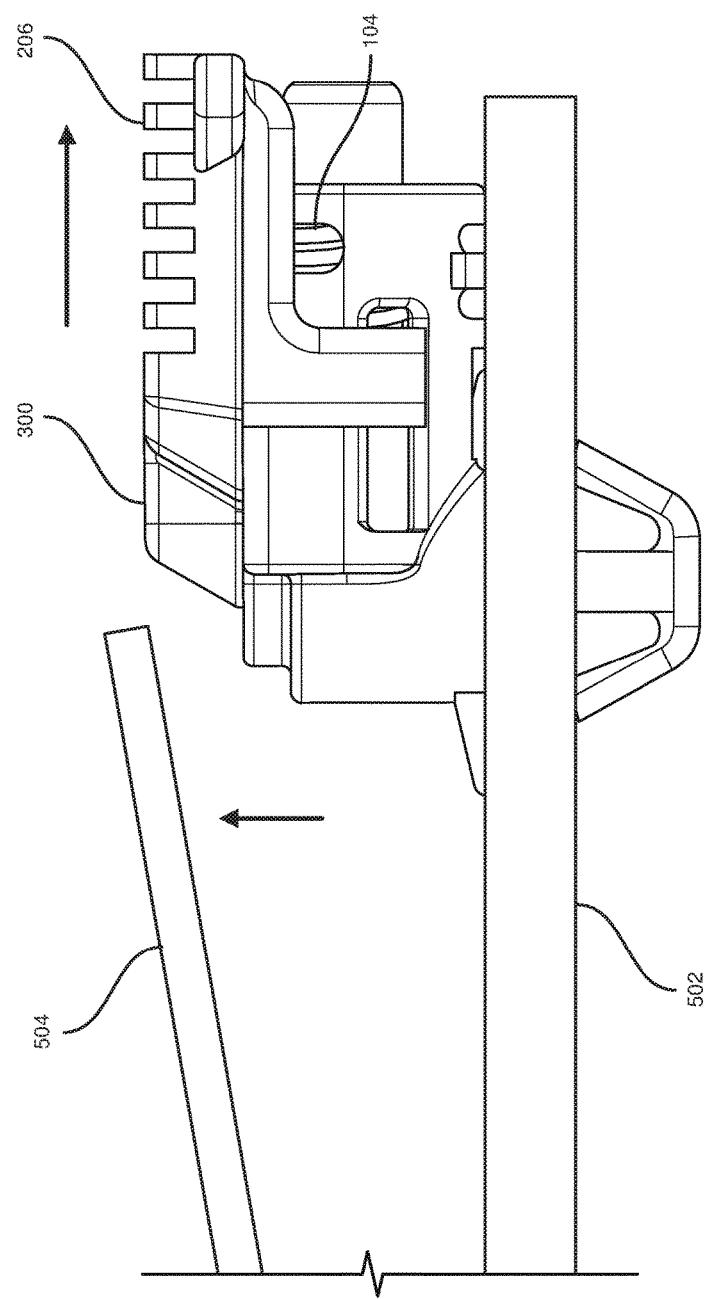
FIG. 6 is a side view of a removal of an expansion card from an unlocked latching mechanism.

FIG. 6 illustrates a side view of a removal of expansion card 504 from unlocked latching mechanism 300. In one embodiment, the horizontal force applied to grip 206 of latching mechanism 300 away from expansion card 504 may compression spring 104 and unlock expansion card 504. Subsequently, expansion card 504 may be uninstalled by lifting away from printed circuit board 502.

Figure 7:
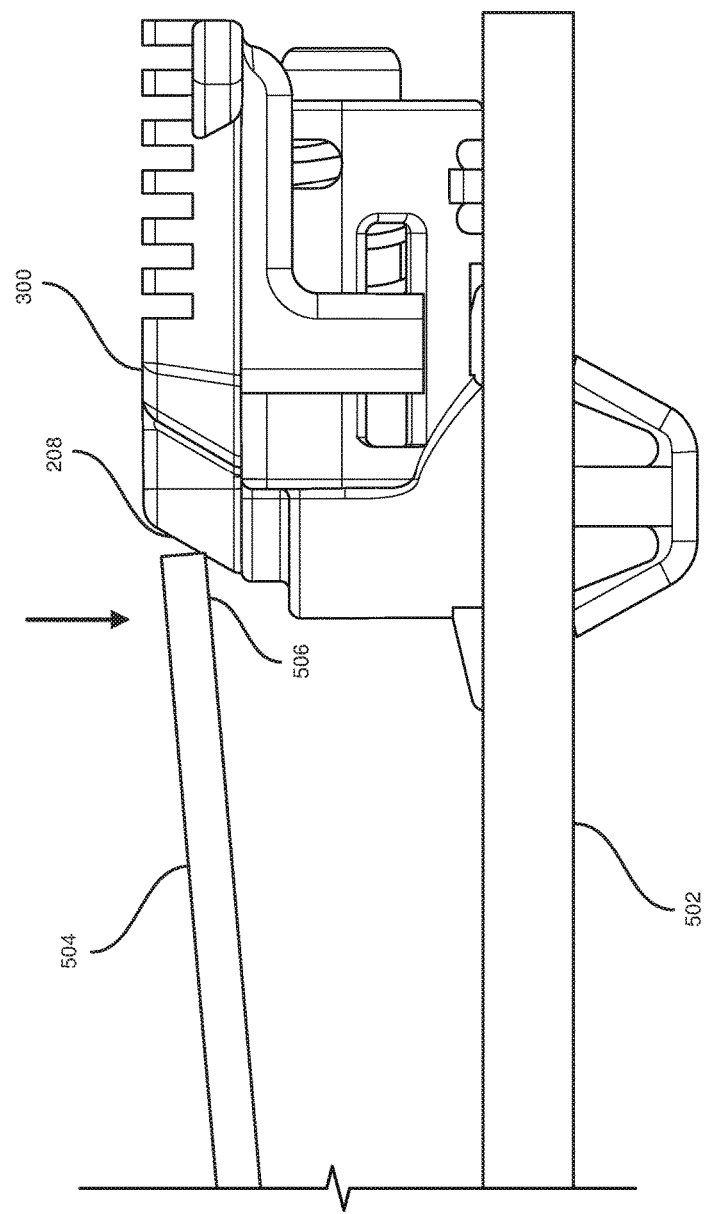
FIG. 7 is a side view of an installation of an expansion card to a printed circuit board.

FIG. 7 illustrates a side view of an installation of expansion card 504 to printed circuit board 502. In one example, a downward force on expansion card 504 may slide proximal end 506 of expansion card 504 along the angled surface of proximal end 208 of latching mechanism 300. In this example, the downward force may cause expansion card 504 to exert a horizontal force against proximal end 208 of latching mechanism 300, thereby unlocking latching mechanism 300 until proximal end 506 of expansion card 504 is under latch 202 of latching mechanism 300. As proximal end 506 of expansion card 504 moves below proximal end 208 of latching mechanism 300, latching mechanism 300 may return to the locked position.

Figure 8:
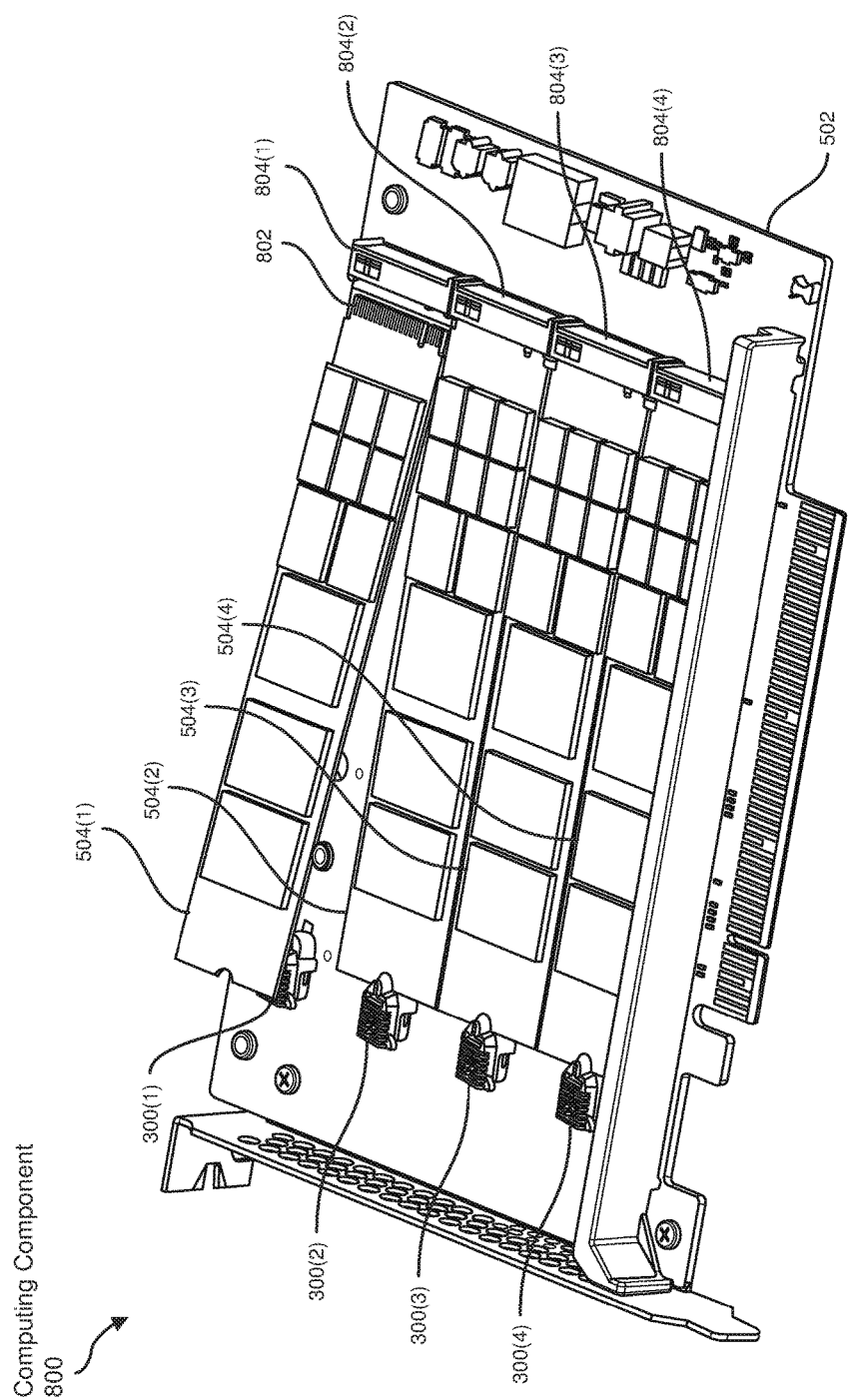
FIG. 8 is a perspective view of a computing component with multiple latching mechanisms locking multiple expansion cards to a printed circuit board.

FIG. 8 illustrates a perspective view of a computing component 800 with multiple latching mechanisms 300(1), 300(2), 300(3), and 300(4) locking multiple expansion cards 504(1), 504(2), 504(3), and 504(4). In some embodiments, computing component 800 may include printed circuit board 502 and latching mechanisms 300(1)-(4) coupled to expansion cards 504(1)-(4). Each of latching mechanisms 300(1)-(4) may include base 102, latch 202, and compression spring 104, as illustrated in FIG. 3. Although shown with a single latching mechanism coupled to each expansion card, computing component 800 may utilize multiple latching mechanisms for a single expansion card. Furthermore, computing component 800 may represent a larger, modular component that may be installed in other computing devices or systems.

In some examples, expansion cards 504(1)-(4) may each be designed to perform a specific computing task. Each of expansion cards 504(1)-(4) may additionally include a connector, such as a connector 802, at a distal end that is dimensioned to be inserted into a socket, such as sockets 804(1)-(4) of printed circuit board 502. In these examples, sockets 804(1)-(4) may electrically couple expansion cards 504(1)-(4) to printed circuit board 502. In the above embodiments, printed circuit board 502 may then connect expansion cards 504(1)-(4) to a computing device.

As illustrated in FIG. 8, expansion cards 504(1)-(4) may be installed or uninstalled from computing component 800 by inserting into or removing from sockets 804(1)-(4). For example, expansion card 504(1) may be installed by first inserting connector 802 to socket 804(1) and then forcing expansion card 504(1) downward until latching mechanism 300(1) locks expansion card 504(1). Conversely, expansion card 504(1) may be removed by first applying the horizontal force to unlock latching mechanism 300(1) and then removing connector 802 from socket 804(1).

Figure 9:
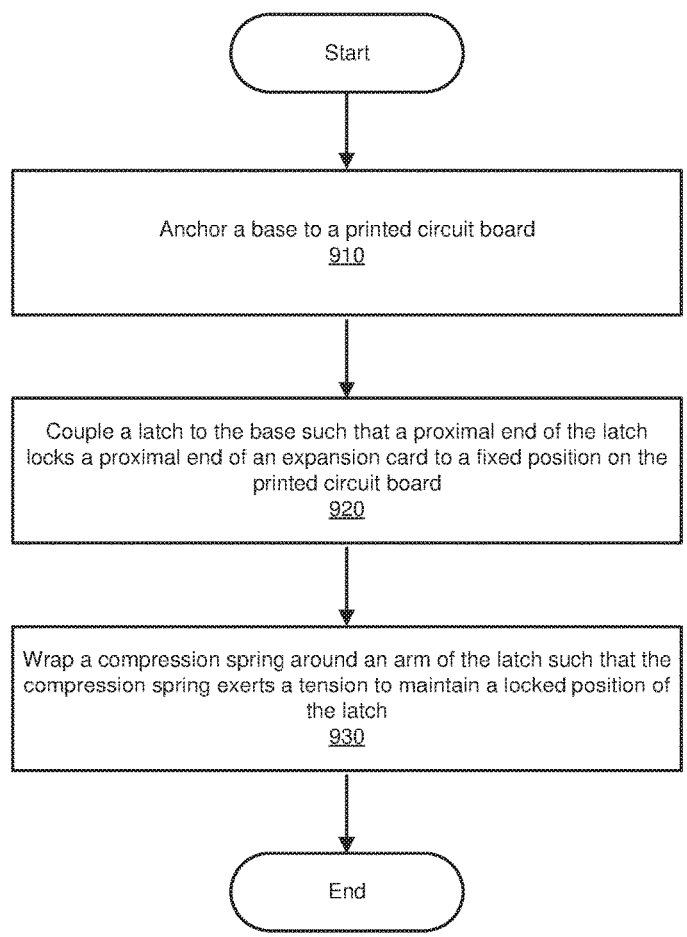
FIG. 9 is a flow diagram of an exemplary method for securing expansion cards to printed circuit boards.

FIG. 9 shows an example method for manufacturing, assembling, using, adjusting, or otherwise configuring or creating the systems and apparatuses presented herein. The steps shown in FIG. 9 may be performed by any individual and/or by any suitable type or form of manual and/or automated apparatus. In particular, FIG. 9 illustrates a flow diagram of an exemplary method 900 for assembling an expansion card latching mechanism.

As shown in FIG. 9, at step 910, a base may be anchored to a printed circuit board. For example, as illustrated in FIG. 3, base 102 may be anchored to printed circuit board 502 such that latching mechanism 300 remains in place.

At step 920, a latch may be coupled to the base such that a proximal end of the latch locks a proximal end of an expansion card to a fixed position on the printed circuit board. Additionally, coupling the latch to the base may include sliding the arm of the latch into the base and covering the base with a grip of the latch. In the example of FIG. 5, proximal end 208 of latch 202 may lock proximal end 506 of expansion card 504 to the fixed position on printed circuit board 502. Arm 204 of FIG. 3 may slide into the body of base 102 while grip 206 may cover the top of base 102.

In additional embodiments, the proximal end of the latch may include an angled surface such that a downward force on the expansion card slides the proximal end of the expansion card along the angled surface and exerts a horizontal force to unlock the latch until the proximal end of the expansion card is under the latch. In the example of FIG. 7, the downward force on expansion card 504 may slide proximal end 506 along the angled surface of proximal end 208 to exert a horizontal force unlocking latching mechanism 300. In this example, latching mechanism 300 may return to the locked position, such as in FIG. 5, after the downward force moves expansion card 504 in place.

At step 930, a compression spring may then be wrapped around an arm of the latch such that the compression spring exerts tension to maintain a locked position of the latch. For example, as illustrated in FIG. 3, compression spring 104 may be wrapped around arm 204 inside the body of base 102 to maintain the tension between latch 202 and base 102.

In some examples, method 900 may further include a step in which the proximal end of the latch may be dimensioned to extend over the proximal end of the expansion card in the locked position of the latch such that the latch prevents the expansion card from lifting upward from the printed circuit board. As illustrated in FIG. 5, proximal end 208 of locked latching mechanism 300 may be dimensioned to extend over proximal end 506 of expansion card 504.

In additional examples, method 900 may further include a step in which the compression spring may be dimensioned to fit within the base and to exert the tension between the latch and the base to force the proximal end of the latch toward the expansion card. In the example of FIG. 5, compression spring 104 may be dimensioned to force proximal end 208 of latching mechanism 300 toward expansion card 504 such that proximal end 208 locks proximal end 506 of expansion card 504 in place.

As discussed throughout the instant disclosure, the disclosed methods, systems, and apparatuses may provide one or more advantages over traditional methods of securing expansion cards to printed circuit boards. For example, the latching mechanisms described herein may be anchored to printed circuit boards as needed to secure expansion cards of various dimensions without a need for additional tools. As another example, by exerting tension between a base and a latch of a latching mechanism, a compression spring may keep the latching mechanism in a locked position. Furthermore, the latching mechanisms described herein may be easily unlocked by applying a horizontal force to a grip of the latch. Thus, the mechanisms described herein may enable faster and easier installation or removal of expansion components in comparison to traditional methods.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An expansion card latching mechanism comprising:
   a base anchored to a printed circuit board;
   a latch coupled to the base such that a proximal end of the latch locks a proximal end of an expansion card to a fixed position on the printed circuit board; and
   a compression spring wrapped around an arm of the latch such that the compression spring exerts a tension between the latch and the base to maintain a locked position of the latch such that a horizontal force compresses the compression spring to unlock the expansion card.

2. The expansion card latching mechanism of claim 1, wherein the latch is coupled to the base such that:
   the arm of the latch slides within the base; and
   a grip of the latch covers the base.

3. The expansion card latching mechanism of claim 2, wherein the horizontal force applied to the grip of the latch, away from the expansion card, compresses the compression spring such that the latch slides away from the locked position to unlock the expansion card.

4. The expansion card latching mechanism of claim 1, wherein the proximal end of the latch extends over the proximal end of the expansion card in the locked position of the latch such that the latch prevents the expansion card from lifting upward from the printed circuit board.

5. The expansion card latching mechanism of claim 1, wherein the proximal end of the latch comprises an angled surface such that a downward force on the expansion card slides the proximal end of the expansion card along the angled surface.

6. The expansion card latching mechanism of claim 5, wherein the downward force on the expansion card exerts the horizontal force to unlock the latch until the proximal end of the expansion card is under the latch.

7. The expansion card latching mechanism of claim 1, wherein the compression spring:
   is dimensioned to fit within the base; and
   exerts the tension between the latch and the base to force the proximal end of the latch toward the expansion card.

8. A computing component comprising:
   a printed circuit board;
   at least one expansion card modularly mounted on the printed circuit board; and
   at least one latching mechanism coupled to the expansion card, wherein the latching mechanism comprises:
   a base anchored to the printed circuit board;
   a latch coupled to the base such that a proximal end of the latch locks a proximal end of the expansion card to a fixed position on the printed circuit board; and
   a compression spring wrapped around an arm of the latch such that the compression spring exerts a tension between the latch and the base to maintain a locked position of the latch such that a horizontal force compresses the compression spring to unlock the expansion card.

9. The computing component of claim 8, wherein the expansion card:
   is designed to perform a specific computing task; and
   comprises a connector at a distal end that is dimensioned to be inserted into a socket of the printed circuit board.

10. The computing component of claim 9, wherein the socket electrically couples the expansion card to the printed circuit board.

11. The computing component of claim 8, wherein the latch is coupled to the base such that:
    the arm of the latch slides within the base; and
    a grip of the latch covers the base.

12. The computing component of claim 11, wherein the horizontal force applied to the grip of the latch, away from the expansion card, compresses the compression spring such that the latch slides away from the locked position to unlock the expansion card.

13. The computing component of claim 8, wherein the proximal end of the latch extends over the proximal end of the expansion card in the locked position of the latch such that the latching mechanism prevents the expansion card from lifting upward from the printed circuit board.

14. The computing component of claim 8, wherein the proximal end of the latch comprises an angled surface such that a downward force on the expansion card slides the proximal end of the expansion card along the angled surface to unlock the latching mechanism until the proximal end of the expansion card is under the latch.

15. The computing component of claim 8, wherein the compression spring:
    is dimensioned to fit within the base; and
    exerts the tension between the latch and the base to force the proximal end of the latch toward the expansion card.

16. A method comprising:
    anchoring a base to a printed circuit board;
    coupling a latch to the base such that a proximal end of the latch locks a proximal end of an expansion card to a fixed position on the printed circuit board; and
    wrapping a compression spring around an arm of the latch such that the compression spring exerts a tension between the latch and the base to maintain a locked position of the latch such that a horizontal force compresses the compression spring to unlock the expansion card.

17. The method of claim 16, wherein coupling the latch to the base comprises:
    sliding the arm of the latch into the base; and
    covering the base with a grip of the latch.

18. The method of claim 16, wherein the proximal end of the latch comprises an angled surface such that a downward force on the expansion card:
    slides the proximal end of the expansion card along the angled surface; and
    exerts the horizontal force to unlock the latch until the proximal end of the expansion card is under the latch.

19. The method of claim 16, further comprising dimensioning the proximal end of the latch to extend over the proximal end of the expansion card in the locked position of the latch such that the latch prevents the expansion card from lifting upward from the printed circuit board.

20. The method of claim 16, further comprising dimensioning the compression spring to:
    fit within the base; and
    exert the tension between the latch and the base to force the proximal end of the latch toward the expansion card.

* * * * *